United States Patent
Yoshii et al.

(10) Patent No.: US 6,704,189 B2
(45) Date of Patent: Mar. 9, 2004

(54) ELECTRONIC DEVICE WITH EXTERNAL TERMINALS AND METHOD OF PRODUCTION OF THE SAME

(75) Inventors: Akitoshi Yoshii, Tokyo (JP); Kazuhiko Kikuchi, Tokyo (JP); Takashi Kamiya, Tokyo (JP); Hiromi Kikuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/404,664

(22) Filed: Apr. 2, 2003

(65) Prior Publication Data

US 2003/0189817 A1 Oct. 9, 2003

(30) Foreign Application Priority Data

Apr. 9, 2002 (JP) ........................................ 2002-106274
Apr. 9, 2002 (JP) ........................................ 2002-106275

(51) Int. Cl.$^7$ ............................................. H01G 4/228
(52) U.S. Cl. ................. 361/308.1; 361/306.1; 361/309
(58) Field of Search .................... 361/306.1, 308.1, 361/309

(56) References Cited

U.S. PATENT DOCUMENTS 5,162,973 A * 11/1992 Miyashita et al. ....... 361/308.1
5,805,409 A * 9/1998 Takahara et al. ............ 361/303
6,046,902 A * 4/2000 Nakagawa et al. ...... 361/306.1
6,201,683 B1 * 3/2001 Yamada et al. .......... 361/308.1
6,388,864 B1 * 5/2002 Nakagawa et al. ......... 361/309

FOREIGN PATENT DOCUMENTS

| JP | A 7-108396 | 4/1995 |
| JP | A 11-74147 | 3/1999 |
| JP | A 11-151591 | 6/1999 |
| JP | A 11-219847 | 8/1999 |
| JP | A 11-329892 | 11/1999 |

* cited by examiner

*Primary Examiner*—Cathy Lam
(74) *Attorney, Agent, or Firm*—Oliff & Berridge, PLC

(57) ABSTRACT

A multilayer ceramic capacitor with external terminals having terminal electrodes and external terminals of the electronic device body electrically bonded through a solder layer, wherein the solder layer is comprised of an Sn—Sb high temperature lead-free solder, the ratio between the Sn and Sb in this solder layer is, by ratio by weight percent, in a range of Sn/Sb=70/30 to 90/10, and the solder layer and terminal electrodes are formed between them with a diffusion layer formed by diffusion of a conductive ingredient of the terminal electrodes into the solder layer.

11 Claims, 8 Drawing Sheets

ELECTRONIC DEVICE WITH EXTERNAL TERMINALS AND METHOD OF PRODUCTION OF THE SAME

BACKGROUND OF THE INVENTION

1. Field of the Invention

The present invention relates to an electronic device with external terminals using a high temperature lead-free solder and a method of production of the same.

2. Description of the Related Art

In general, an electronic device such as a composite multilayer capacitor is provided with external terminals bonded to terminal electrodes for electrical connection with a circuit board etc. As the method for bonding the external terminals of such an electronic device to a circuit board etc., methods using soldering are frequently used. Further, since the external terminals of the electronic device will be mounted on the circuit board by solder, they have solder heat resistance and solder wettability.

The terminal electrodes of an electronic device have underlayer electrodes comprised of copper etc. formed by coating and baking a paste on the material of the body of the electronic device, nickel plating for giving solder heat resistance, and tin plating for giving solder wettability. These plating layers and external terminals are bonded by a high temperature solder.

The external terminals and circuit board are also connected using a high temperature solder. This high temperature solder is required not to melt or be difficult to melt at a high temperature (that is, have reflow resistance) and to be able to retain mechanical strength at a high temperature. Here, a "high temperature solder" means a solder having a solidus temperature of at least 183° C.

In general, among solders comprised of various types of metal compositions, in the Pb—Sn system, a high temperature solder having 95 wt % of Pb and 5 wt % of Sn (solidus temperature 307° C. and liquid temperature 327° C.) or a high temperature solder having 90 wt % of Pb and 10 wt % of Sn (solidus temperature 270° C. and liquid temperature 301° C.) is being used. Further, in the Pb—Ag system, a high temperature solder having 97.5 wt % of Pb and 2.5 wt % of Ag (solidus temperature 304° C. and liquid temperature 304° C.) is being used. Further, in the Pb—Ag—Sn system, a high temperature solder having 97.5 wt % of Pb, 1.5 wt % of Ag, and 1 wt % of Sn (solidus temperature 309° C. and liquid temperature 309° C.) is being used.

The above high temperature solders include at least 90 wt % of Pb to reduce the cost or to obtain reflow resistance.

Further, for example, inside a coil, transformer, etc. of an electronic device, an insulated conductor is wound around a magnetic material or other support. When bonding the end of such a winding with the device etc., soldering is generally used. At the time of this soldering, unless the coating portion comprised of polyurethane etc. of the insulated conductor is destroyed by the heat of the solder etc., soldering is not possible. Therefore, as the temperature of soldering, one inside a temperature range of 380° C. to 420° C. is generally employed. For this reason as well, the above high temperature solders contain at least 90 wt % of Pb.

Note that at the present time, to bond a circuit board etc. and an electronic device etc., in the Pb—Sn system, a solder having 37 wt % of Pb and 63 wt % of Sn (solidus temperature 183° C. and liquid temperature 183° C.) and in the Pb—Ag—Sn system, a solder having 36 wt % of Pb, 2 wt % of Ag, and 62 wt % of Sn (solidus temperature 179° C. and liquid temperature 190° C.) are being used. With these solders, generally soldering is performed at a reflow temperature of a temperature range of 220° C. to 240° C.

Note that if the solder used for internal bonding of an electronic device etc. mounted on a circuit board melts at the time of soldering, the molten solder flows out and the flowing solder becomes spherical and for example bridges circuits on a circuit board with circuits arranged at a high density and fine pitch. To avoid this, it is necessary to use a solder which does not melt or is difficult to melt (that is, has reflow resistance) even at the above reflow temperature. Therefore, in general, it is desirable to use a high temperature solder having a solidus temperature of at least 240° C. or more even for the solder used for internal bonding of an electronic device etc.

As explained above, Pb is a metal essential for solder. Solder containing Pb is being used as the most effective solder after a long time in the process of bonding in electronic apparatuses. Its reliability has also been established. However, due to dumping etc. of electronic products using such solder in the natural world, the Pb contained in the solder gradually leaches out and is liable to lead to Pb pollution of the ground water.

Therefore, instead of the above Pb-containing Pb—Sn eutectic solder or close to eutectic solder, demand is rising for the development of Pb-free solder (lead-free solder). As such lead-free solder, Sn—Ag, Sn—Zn, and Sn—Bi solders are promising, but the liquid temperatures of these solders are 10° C. to 20° C. higher than the liquid temperatures of the solders currently being used in connection of circuit boards etc. and electronic devices.

The general reflow temperature at the time of soldering is expected to be in the range from 230° C. to 260° C. Accordingly, it becomes necessary to use high temperature lead-free solder which will not melt or will be difficult to melt (that is, has reflow resistance) even at such a reflow temperature.

Further, solders having performances equal to those of a Pb-system solder in the point of the tensile strength, load resistance, and other mechanical strength properties of the soldered parts between the terminal electrodes and external electrodes of the electronic device after soldering are also being demanded.

When generally soldering composite multilayer capacitors, circuit modules, and other electronic devices, high temperature solder is often used, but for example a medium-high temperature lead-free solder having a solidus temperature of at least 200° C. sufficient in bond strength etc. has not been obtained.

That is, soldering of a conventional electronic device and external terminals is bonding by a melting reaction at the outside (electronic device side) of the nickel plating formed for the solder heat resistance of the external terminals. Therefore, the bond strength between the electronic device and external terminals was not sufficient and there were problems in mounting.

SUMMARY OF THE INVENTION

A first object of the present invention is to provide an electronic device with external terminals superior in the tensile strength, load resistance, and other mechanical strength properties of the soldered parts, superior in reflow resistance as well, and free from concern over environmental pollution, and a method of production of the same.

A second object of the present invention is to provide an electronic device with external terminals having a large tensile strength, that is, bond strength, between the terminal electrodes and external terminals, superior in reflow, and not containing lead and therefore completely environmentally friendly.

To achieve the above objects, according to a first aspect of the present invention, there is provided an electronic device with external terminals having terminal electrodes and external terminals of the electronic device body electrically bonded through solder layers, wherein said solder layers are comprised of an Sn—Sb high temperature lead-free solder, the ratio of Sn and Sb in the solder layers being, by weight percent, within a range of Sn/Sb=70/30 to 90/10, and said solder layers and terminal electrodes are formed between them with diffusion layers formed by diffusion of the conductive ingredients of said terminal electrodes to the solder layers.

According to the first aspect of the present invention, since the metal composition of the solder layers is an Sn—Sb system, no lead is contained and there is no concern over environmental pollution. Further, since the metal composition of the solder layers is, by ratio of weight percent, Sn/Sb=70/30 to 90/10 and the conductive ingredients of the terminal electrodes of the electronic device body diffuse into the solder layers to form diffusion layers at the soldered parts, it is possible to provide an electronic device with external terminals superior in tensile strength, load resistance, and other mechanical strength properties.

Preferably, said external terminals are comprised of members able to elastically deform in a length direction of said electronic device body. By elastic deformation of the external terminals, it is possible to absorb deformation due to the difference in heat expansion between the electronic device body and the circuit board on which it is mounted.

Preferably, said solder layers are comprised of an Sn—Sb high temperature solder having a solidus temperature of at least 240° C.

Preferably, said terminal electrodes have layers comprised mainly of Cu and the ingredients diffused into said diffusion layers are comprised mainly of Cu.

Preferably, said terminal electrodes have underlayer electrodes comprised mainly of Cu, Ni plating layers formed on the surfaces of said underlayer electrodes, and Sn plating layers formed on the surfaces of the Ni plating layers, and the Cu diffused into said diffusion layers diffuses there by passing through said Ni plating layers and Sn plating layers.

According to a second aspect of the present invention, there is provided an electronic device with terminal electrodes having terminal electrodes and external terminals of the electronic device body electrically bonded through solder layers, wherein said solder layers and terminal electrodes are formed between them with diffusion layers having thicknesses of at least 5 μm formed by diffusion of conductive ingredients of said terminal electrodes into the solder layers.

In the electronic device with external terminals according to the second aspect of the present invention, since diffusion layers of thicknesses of at least 5 μm are formed at the solder layers bonding the terminal electrodes and external terminals, the tensile strength between the terminal electrodes and external terminals is improved.

Preferably, said solder layers are comprised of an Sn—Sb high temperature solder having a solidus temperature of at least 240° C.

Preferably, said terminal electrodes have underlayer electrodes comprised mainly of Cu, and the conductive ingredients diffused in said solder layers are Cu.

Preferably, said terminal electrodes have underlayer electrodes comprised mainly of Cu and Ni plating layers formed on the surfaces of the underlayer electrodes, and the Cu of the conductive ingredients diffusing into the solder layers diffuse there through the Ni plating layers.

Preferably, said solder layers are comprised of an Sn—Sb high temperature lead-free solder, and the ratio between the Sn and Sb in the solder layers is, by ratio of weight percent, in the range of Sn/Sb=70/30 to 90/10.

Preferably, said external terminals are comprised of members able to elastically deform in a length direction of said electronic device body.

The method of production of an electronic device with external terminals according to the first aspect of the present invention comprises the steps of preparing a high temperature lead-free solder comprised of a cream solder having a metal composition of, by ratio of weight percent, Sn/Sb=70/30 to 90/10 and a solidus temperature of at least 240° C., depositing said high temperature lead-free solder between the external terminals and external terminals of the electronic device body, and heating said terminal electrodes and external terminals to a temperature range of a maximum temperature of 310° C. to 340° C. and bonding them through solder layers, when heating and bonding said terminal electrodes and external terminals, conductive ingredients of said terminal electrodes diffusing into said solder layers and forming diffusion layers between said solder layers and external terminals.

Preferably, the metal composition has a ratio by weight percent of Sn/Sb=approximately 80/20.

The method of production of an electronic device with external terminals according to the second aspect of the present invention comprises the steps of preparing a high temperature lead-free solder comprised of a cream solder having a metal composition of, by ratio of weight percent, Sn/Sb=approximately 90/10 and a solidus temperature of at least 240° C., depositing said high temperature lead-free solder between the external terminals and external terminals of the electronic device body, and heating said terminal electrodes and external terminals to a temperature range of a maximum temperature of 325° C. to 350° C. and bonding them through solder layers, when heating and bonding said terminal electrodes and external terminals, conductive ingredients of said terminal electrodes diffusing into said solder layers and forming diffusion layers between said solder layers and external terminals.

According to the methods of production of the first and second aspects of the present invention, it is possible to efficiently produce electronic devices with external terminals according to the first and second aspects of the present invention.

In the first and second aspects of the present invention, preferably the thicknesses of said diffusion layers are at least 5 μm. Note that the upper limit of the thicknesses of the diffusion layers is not more than the thicknesses of the solder layers. Specifically, the thicknesses of the diffusion layers are preferably 5 to 20 μm, more preferably 5 to 10 μm.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

First Embodiment

Figure 1:
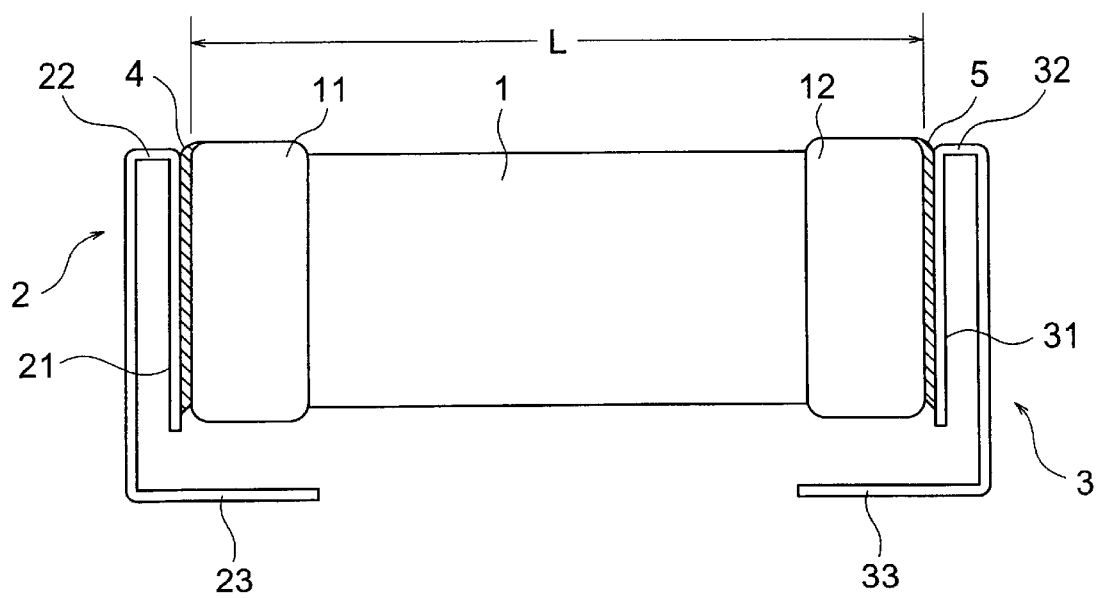
FIG. 1 is a front view of an electronic device with external terminals according to an embodiment of the present invention.
Figure 2:
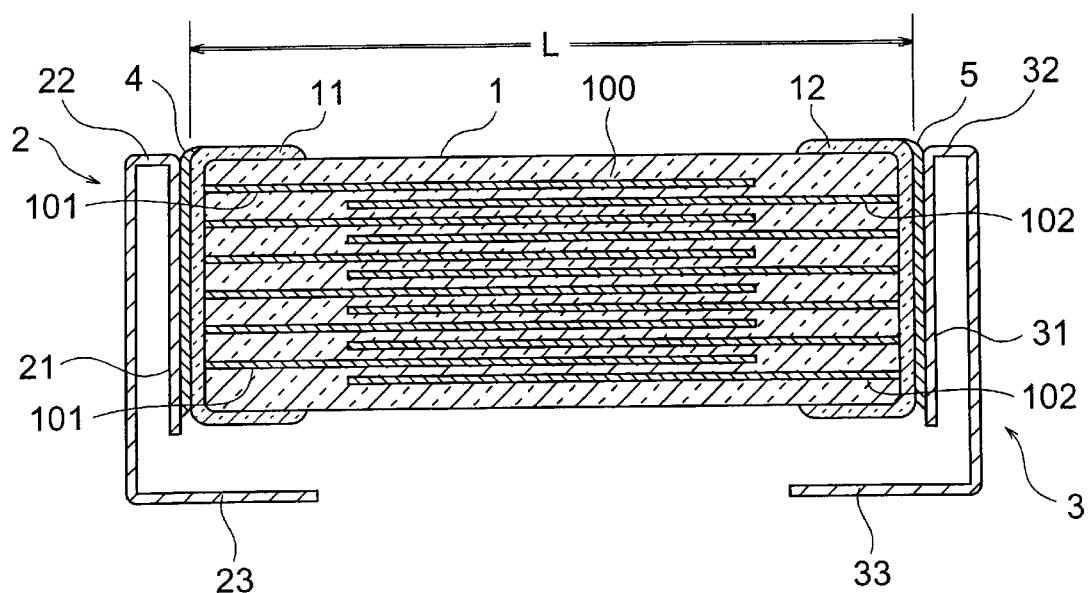
FIG. 2 is a vertical sectional view of an electronic device with external terminals shown in FIG. 1.

The electronic device with external terminals shown in FIG. 1 and FIG. 2 for example has a ceramic capacitor body (electronic device body) 1 comprising an electronic device body of a rectangular parallelopiped shape and a pair of external electrodes 2 and 3. The ceramic capacitor body 1 has terminal electrodes 11 and 12 comprised of Cu, which are attached with both end surfaces opposing to each other along the length direction.

As shown in FIG. 2, the ceramic capacitor body 1 has a large number of (for example, 100) internal electrodes 101 and 102 inside a ceramic dielectric body 100. The internal electrodes 101 are connected at one ends to the terminal electrode 11, while are left free at the other ends. The internal electrodes 102 are connected at one ends to the terminal electrode 12, while are left free at the other ends. The terminal electrodes 11 and 12 and the materials of the internal electrodes 101 and 102 and the ceramic dielectric body 100 used are known ones produced by known manufacturing methods.

The external terminal 2 has one end 21 connected to the terminal electrode 11, has a part 22 folded back at its middle, and has the projecting end of the folded back part 22 bent inside to an L-shape serving as a terminal 23 for connection to an external conductor. The external terminal 3, in the same way as the external terminal 2, has one end 31 connected to the terminal electrode 12, has a part 32 folded back at its middle, and has the projecting end of the folded back part 32 bent inside to a reverse L-shape serving as a terminal 33 for connection to an external conductor.

The external terminals 2 and 3 are formed by materials low in electrical resistance and superior in springiness. The external terminals 2 and 3 are for example formed by a phosphor bronze sheet material. The thicknesses are not limited, but typically are about 0.1 mm.

Since the external terminals 2 and 3 have parts 22 and 32 folded back at their middles, they can elastically deform in the length direction L of the capacitor body 1 and can absorb differences in heat expansion and contraction in the length direction L with the circuit board to which the body 1 is connected through the external terminals 2 and 3.

Ends 21 and 31 of the external terminals 2 and 3 are connected to end faces of the terminal electrodes 11 and 12 by solder layers 4 and 5. As the solder forming the solder layers 4 and 5, a high temperature lead-free solder comprised of cream solder having a metal composition of, by ratio by weight percent, Sn/Sb=70/30 to 90/10 and a solidus temperature of at least 240° C. is used.

Further, the high temperature lead-free solder is deposited on each of the terminal electrodes 11 and 12 and the ends 21 and 31 of the external terminals 2 and 3 and heated to a temperature range of a reflow maximum temperature of 310° C. to 340° C. so as to bond the terminal electrode 11 and the end 21 of the external terminal 2 and the terminal electrode 12 and the end 31 of the external terminal 3 through the solder layers 4 and 5. As a result, it is possible to produce an electronic device with external terminals having the external terminals 2 and 3 bonded to the outsides of the terminal electrodes 11 and 12 of the ceramic capacitor body 1.

Figure 3:
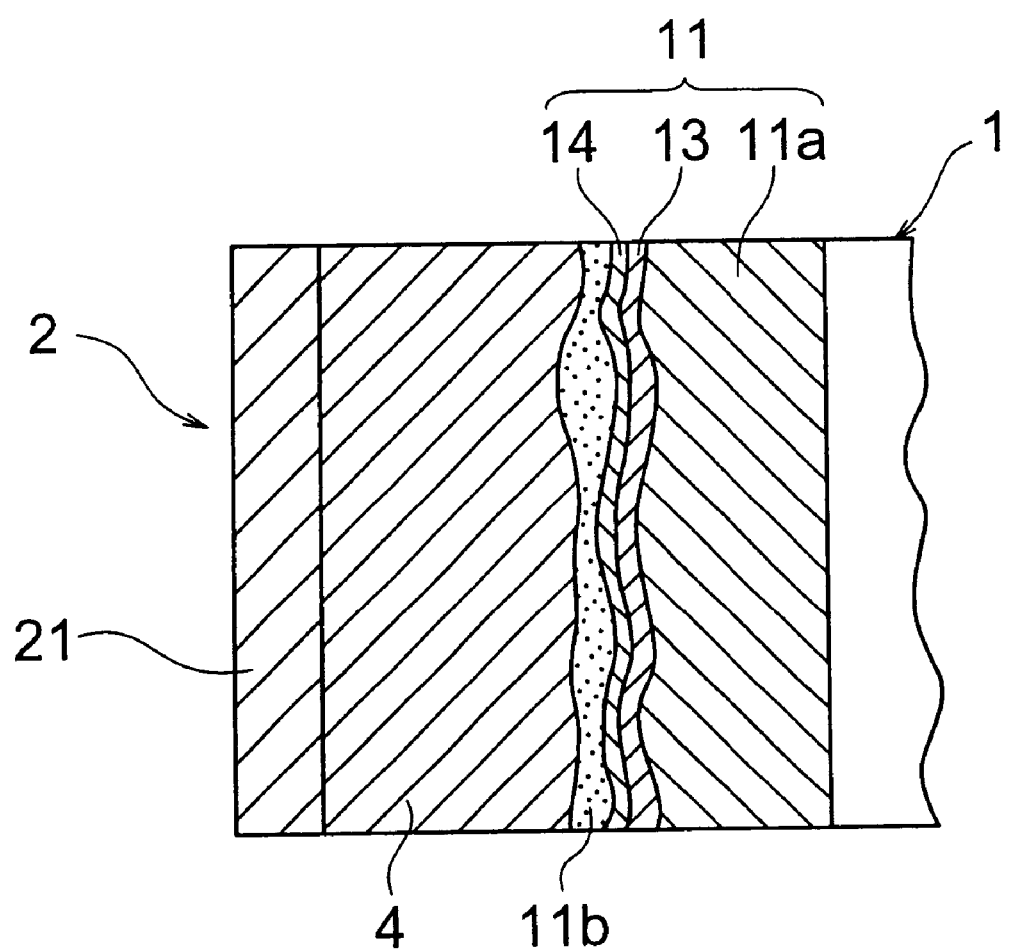
FIG. 3 is a partial enlarged end view of the bond structure between the terminal electrodes and external metal connection terminals of an electronic device with external terminals shown in FIG. 2.

In this case, as shown enlarged in FIG. 3, the conductor ingredient of the underlayer electrode 11a comprised mainly of Cu forming the terminal electrode 11 passes through the Ni plating layer 13 and Sn plating layer 14 forming the terminal electrode 11 to diffuse in the solder layer 4. As a result, the soldered part is formed with a Cu diffusion layer 11b enhancing the tensile strength between the terminal electrode 11 and the end 21 of the external terminal 2. The thickness of the diffusion layer 11b is for example 5 to 40 μm. Note that the solder layer 5 at the other terminal electrode 12 side, while not shown, is also formed with a similar Cu diffusion layer.

Figure 4:
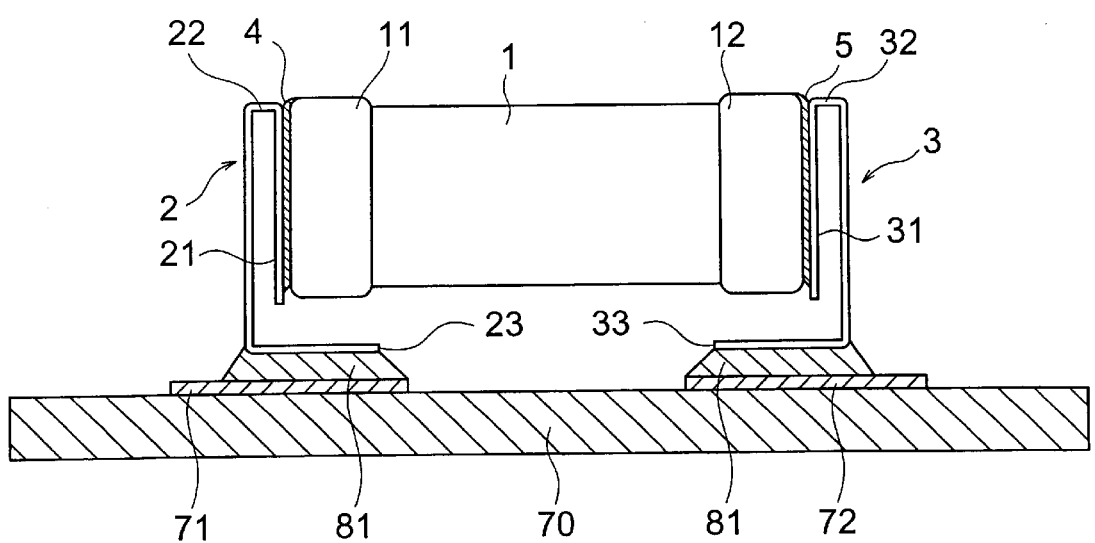
FIG. 4 is a partial sectional view of the state of connection of the electronic device shown in FIG. 1 to a circuit board.

FIG. 4 is a partial sectional view of the state when mounting the electronic device with external terminals shown in FIG. 1 and FIG. 2 on a circuit board 70.

The electronic device with external terminals is for example mounted on the circuit board 70. The surface of the circuit board 70 is provided with conductor patterns 71 and 72. The terminal of the external terminal 2 provided at the electronic device with external terminals is soldered to the conductor pattern 71 by the solder 81, while the terminal 33 of the external terminal 3 is soldered to the conductor pattern 72 by the solder 81.

In the electronic device with external terminals of the present embodiment, the at least one pair of external terminals 2 and 3 provided, as explained above, are connected at ends 21 and 31 to the terminal electrodes 11 and 12 of the ceramic capacitor body 1. Further, the external terminals 2 and 3 have parts 22 and 32 folded back at their middles. The projecting end sides of the folded back parts 22 and 32 have terminals 23 and 33 to be connected with external conductors, that is, the conductor patterns 71 and 72 of the circuit board 70.

According to the external terminals 2 and 3 of this structure, due to the folded back parts 22 and 32 provided at their middles, the lengths (heights) from the terminals 23 to 33 to the ends 21 and 31 are increased.

Further, the terminals 23 and 33 are arranged spaced apart at the bottom side of the ceramic capacitor body 1, so the increase in the area occupied by the terminals 23 and 33 at the circuit board 70 side is suppressed and the mounting area can be reduced.

In the present embodiment, as the solder forming the solder layers 4 and 5, a high temperature lead-free solder not melting or difficult to melt (that is, having reflux resistance) in a range of reflow temperature of 230° C. or more is used. As the high temperature lead-free solder, specifically one having a metal composition of the Sn—Sb system, having a ratio of Sn/Sb by weight percent of 70/30 to 90/10, and having a solidus temperature of at least 240° C. is suitable.

Similarly, the above high temperature lead-free solder is used for the solder 81 used for soldering the terminal 23 of the external terminal 2 and the conductor pattern 71 and the solder 81 used for soldering the terminal 33 of the external terminal 3 and the conductor pattern 72.

Here, samples comprised of seven types of electronic devices with external terminals obtained using high temperature lead-free solder of different solder compositions (Sample 1 to Sample 7) were tested. The results of a test of the tensile strength using piano wire 51 as a tensile device shown in FIG. 5 (n=average for 10 pieces) and the results of judgment for a load test by a weight 61 shown in FIG. 6 (in high temperature tank of 240° C., 250° C., and 260° C.) are shown in Table 1.

TABLE 1

| Sample | Solder composition (Sn/Sb) | Tensile strength (n = average of 10) (kgf) | Load test (10 min) 240° C. | Load test (10 min) 250° C. | Load test (10 min) 260° C. | Overall judgment |
|---|---|---|---|---|---|---|
| Sample 1 | 100/0 | 10.2 | NG | NG | NG | NG |
| Sample 2 | 95/5 | 9.5 | OK | NG | NG | NG |
| Sample 3 | 90/10 | 9.5 | OK | OK | OK | OK |
| Sample 4 | 80/20 | 8.5 | OK | OK | OK | OK |
| Sample 5 | 70/30 | 5.0 | OK | OK | OK | OK |
| Sample 6 | 60/40 | 1.2 | OK | OK | OK | NG |
| Sample 7 | 50/50 | 0.6 | OK | OK | OK | NG |

Figure 5:
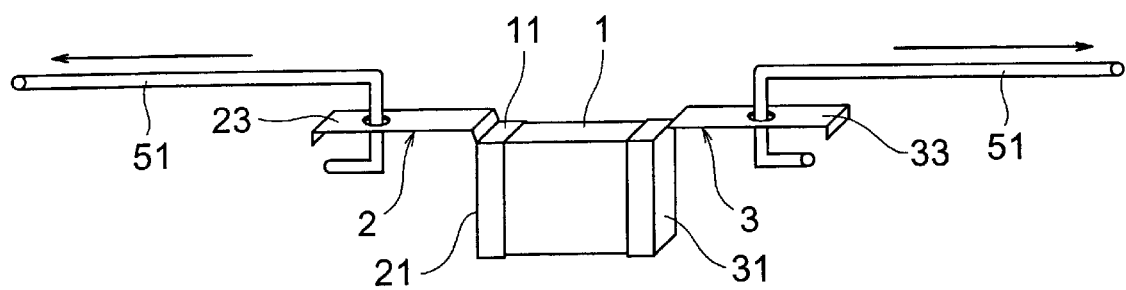
FIG. 5 is a perspective view of a specific example of a tensile strength test.

The tensile strength test was performed as follows as shown in FIG. 5. That is, the terminals 23 and 33 of the external terminals 2 and 3 of the Sample 1 to Sample 7 were spread open outward, pieces of piano wire 51 bent into hook shapes were engaged in holes at the external terminals 2 and 3, and the tensile strengths were measured by usual tensile strength tests.

Figure 6:
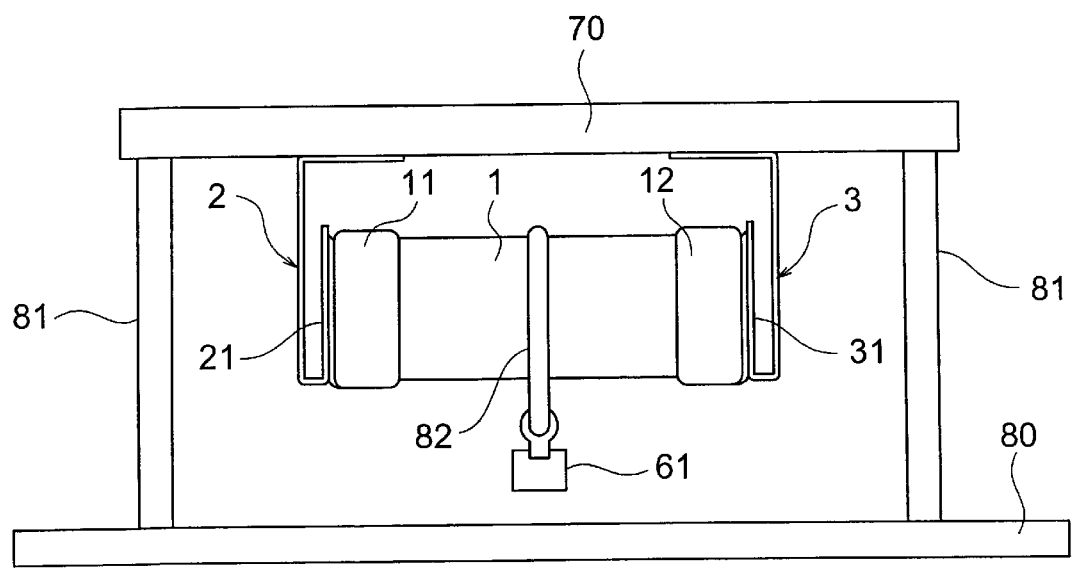
FIG. 6 is front view of a specific example of a load test.

Further, the load test using the weight 61 was performed as follows as shown in FIG. 6. That is, a circuit board 70 on which an electronic device with external terminals was mounted was supported in a horizontal arrangement, in a state with the electronic device with the external terminals facing down, on a table 80 using supports 81 in the high temperature tank (at the temperatures of 240° C., 250° C., and 260° C.). Next, a weight 61 (30 g) was suspended from the bottom end of a wire 82 wrapped around the outside of the ceramic capacitor body 1.

Samples where the suspension of the weight 61 resulted in the terminal electrodes 11 and 12 separating from the external terminals 2 and 3 within 10 minutes were judged as no good ("NG"), while ones where no abnormalities occurred for 10 minutes or more were judged as good ("OK").

Further, the high temperature lead-free solders used for Sample 1 to Sample 7 had ratios of Sn/Sb by weight percent of 100/0, 95/5, 90/10, 80/20, 70/30, 60/40, and 50/50, respectively.

Further, for Sample 3 to Sample 5, high temperature lead-free solders having solidus temperatures of at least 240° C. were used.

As will be clear from Table 1, the Sample 3, Sample 4, and Sample 5 all exhibited good tensile strengths of 9.5 kgf, 8.5 kgf, and 5.0 kgf, respectively, the results of the load tests were good ("OK") at the heating temperatures of 240° C., 250° C., and 260° C., and the samples were all judged overall to be good ("OK"). Note that in the overall judgment, samples were judged to be "OK" when the tensile strengths were at least 3.0 kgf and the results of the load tests were all "OK" and were judged to all be "NG" in other cases.

While the Sample 1 and Sample 2 both exhibited good tensile strengths of 10.2 kgf and 9.5 kgf, respectively, the results of the load tests were no good ("NG") at the heating temperatures of 240° C., 250° C., and 260° C. or "NG" at the heating temperatures of 250° C. and 260° C., so in the end the samples were judged overall to be "NG".

Further, while the Sample 6 and Sample 7 both gave good ("OK") results in the load test in the ranges of 240° C., 250° C., and 260° C., the tensile strengths were too small (weak) ones of 1.2 kgf and 0.6 kgf and the mechanical strengths were insufficient, so the samples were judged as "NG".

From the above, it was confirmed that it is preferable to use a high temperature lead-free solder for forming solder layers 4 and 5 having a metal composition of the Sn—Sb system, having an Sn/Sb ratio by weight percent of 70/30 to 90/10, and having a solidus temperature in the range of 240° C. or more. By using this high temperature lead-free solder, it is possible to obtain a bond structure between the terminal electrode 11 and external terminal 2 superior in tensile strength and load resistance. Alternatively, it is possible to obtain a bond structure between the terminal electrode 12 and external terminal 3 superior in tensile strength and load resistance.

Similarly, it was confirmed that it is preferable to use the above Sn—Sb high temperature lead-free solder as the solder 81 used for soldering the terminal 23 of the external terminal 2 and the conductor pattern 71. Further, similarly, it was confirmed that it is preferable to use the above Sn—Sb high temperature lead-free solder as the solder 81 used for soldering the terminal 33 of the external terminal 3 and the conductor pattern 72. In this case as well, in the same way as the above case, it is possible to obtain a bond structure superior in tensile strength and load resistance.

Next, the maximum temperature at the time of reflow bonding between the terminal electrodes 11 and 12 and the external terminals 2 and 3, the presence of a diffusion layer, the results of a tensile test, and the results of a load test at 260° C. will be explained for electronic devices with external terminals using the solder of Sample 4 (Sn/Sb=80/20).

TABLE 2

Solder Layer of Sn/Sb = 80/20

| Maximum temperature at reflow (° C.) | Diffusion layer in solder layer | Tensile strength (kgf) | 260° C. load test |
|---|---|---|---|
| 300 | No | 0.3 | NG |
| 310 | Yes | 5.3 | OK |
| 325 | Yes | 8.5 | OK |
| 340 | Yes | 6.8 | OK |
| 345 | No | 1.3 | NG |

As shown in Table 2, when setting the maximum temperature at the time of reflow to 310° C., 325° C., and 340° C., it is learned that a Cu diffusion layer 11b such as shown in FIG. 3 is present in the solder layer 4. When the maximum temperature at the time of reflow is 300° C., there is no Cu diffusion layer 11b, the tensile strength is a too small (weak) 0.8 kgf, and the result of the load test at 260° C. is no good ("NG"). With a maximum temperature at the time of reflow of 300° C., it is believed that the reflow temperature is low and the Cu ingredients of the terminal electrodes 11 and 12 cannot diffuse in the solder layers 4 and 5.

Further, when the maximum temperature at the time of reflow is 345° C., there is no Cu diffusion layer 11b, the tensile strength is a too small (weak) 1.3 kgf, and the result of the load test is "NG". When the maximum temperature at the time of reflow is 345° C., it is believed that the temperature is too high, the Cu diffusion layer 11b is not formed, the ingredients of the high temperature lead-free solder end up diffusing in the terminal electrodes 11 and 12, and the tensile strengths between the terminal electrodes 11 and 12 and the external terminals 2 and 3 end up being lowered.

From the above, by setting the maximum temperature at the time of reflow for connecting the terminal electrodes and external terminals in the range of 310° C. to 340° C., the reflux resistance in the later reflowing is improved and it is possible to obtain a bond structure free from the danger of detrimental effects due to melting of the solder.

The present invention is not limited to the above embodiment and can be similarly applied to an electronic device with external terminals of a structure connecting and arranging two or three or more ceramic capacitor bodies 1 between a pair of external terminals.

Further, the electronic device with external terminals of the present invention is suitably used as a smoothening capacitor for a switching power source.

As explained above, according to the present invention, it is possible to produce an electronic device with external terminals free from concern about environmental pollution, superior in tensile strength, load resistance, and other mechanical strength properties, and free from the fear of bridging of circuits etc. due to melting of solder.

Further, according to the method of production of an electronic device with external terminals of the present invention, it is possible to easily produce an electronic device with external terminals free from concern about environmental pollution, superior in reflux resistance, and superior in tensile strength, load resistance, and other mechanical strength properties.

Second Embodiment

Next, another embodiment of the present invention will be explained. The composite multilayer capacitor of the present embodiment is similar in appearance to the electronic device with external terminals of the first embodiment shown in FIG. 1 and FIG. 2 and differs in only the bonded parts of the terminal electrodes 11 and 12 and the external terminals 2 and 3. Below, members common to both will be assigned the same reference numerals and explanations thereof will be partially omitted.

Figure 7:
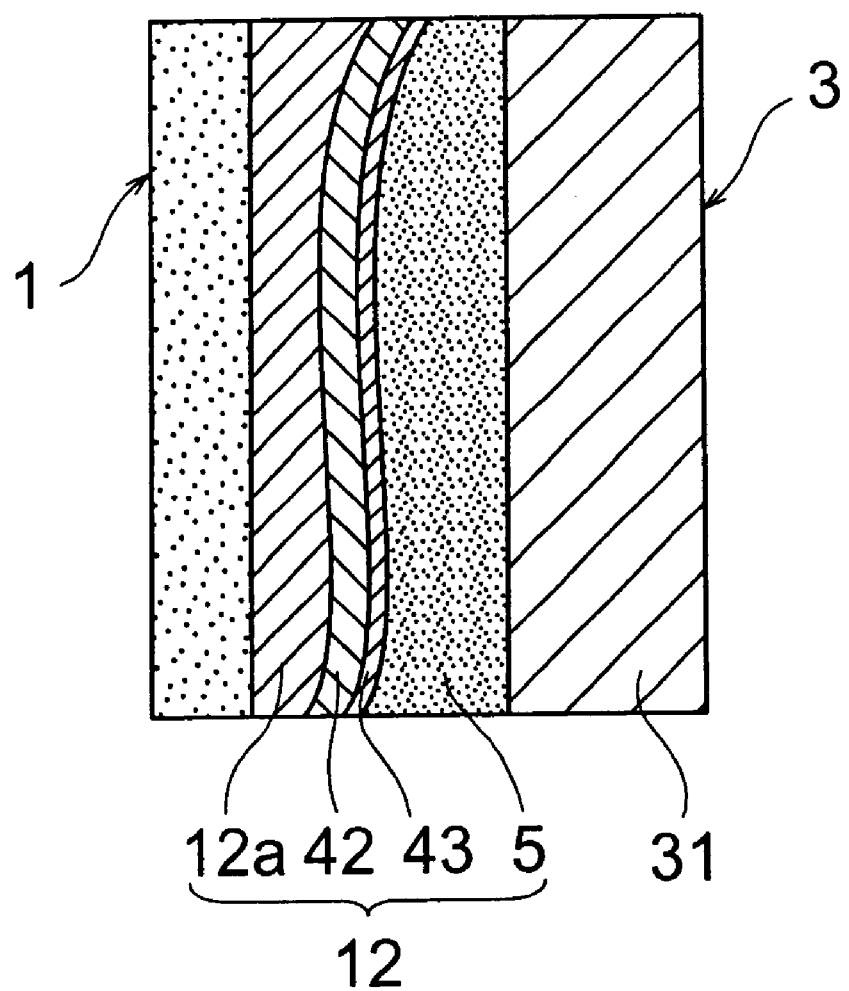
FIG. 7 is a partial enlarged end view of the bond structure between terminal electrodes and external metal connection terminals of an electronic device with external terminals according to another embodiment of the present invention.

In the second embodiment, when forming the solder layer 5 shown in FIG. 7, high temperature solder not melting or difficult to melt (that is, having reflux resistance) in a range of for example the reflow temperature of 200° C. or more is used. As the high temperature lead-free solder, specifically, one having a metal composition of the Sn—Sb system, having a ratio by weight percent of Sn/Sb of for example 90/10, having a solidus temperature of at least 240° C., and having a liquid temperature of 268° C. is preferred.

Similarly, it is possible to use the above high temperature lead-free solder as the solder 81 used for soldering the terminal 23 of the external terminal 2 and the conductor pattern 71 shown in FIG. 4. Further, it is possible to use the above-mentioned high temperature lead-free solder as the solder 81 used for soldering the terminal 33 of the external terminal 3 and the conductor pattern 72 shown in FIG. 4.

Next, the bond structure between the terminal electrode 12 and the terminal 31 of the external terminal 3 using the solder layer 5 of the present embodiment (same for bond structure between terminal electrode 11 and terminal 21 of external terminal 2) will be explained in detail with reference to FIG. 7.

As shown in FIG. 7, the terminal electrode 12 is comprised of an underlayer electrode 12a comprised mainly of Cu, a nickel (Ni) plating layer 42 for giving solder heat resistance, and a tin (Sn) plating layer 43 for giving solder wettability.

Further, the terminal electrode 12 and terminal 31 of the external terminal 3 are bonded by the solder layer 5 of a Sn—Sb high temperature lead-free solder. Note that the tin plating layer 43 becomes a state mixed by diffusion in the Sn—Sb high temperature lead-free solder, that is, the solder layer 5, at the time of soldering.

That is, expressing the bond structure of this embodiment more specifically, the structure becomes, in order from the left side of FIG. 7, the ceramic capacitor body 1, the underlayer electrode 12a, the nickel plating layer 42, the tin plating layer 43, the Sn—Sb high temperature lead-free solder 5, and the terminal 31 of the external terminal 3.

Here, Sample 21 to Sample 24 of four types of composite multilayer capacitors obtained using the above high temperature lead-free solder and reflowing by a reflow furnace were prepared for bonding the terminal electrodes 11 and 12 and the external terminals 2 and 3.

Figure 8A:
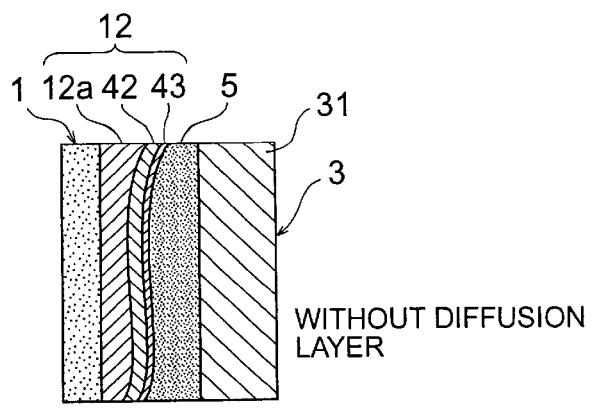
FIG. 8A is a sectional view of main parts showing schematically the structure of a Sample 21 where a solder diffusion layer does not appear.
Figure 8B:
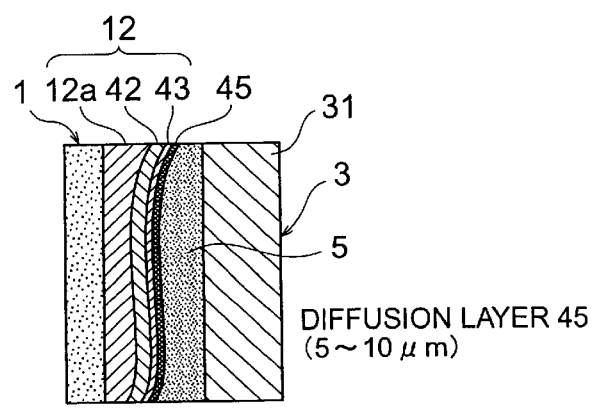
FIG. 8B to FIG. 8D are sectional views of main parts showing schematically the structure of a Sample 22 to Sample 24 where solder diffusion layers appear.
Figure 8C:
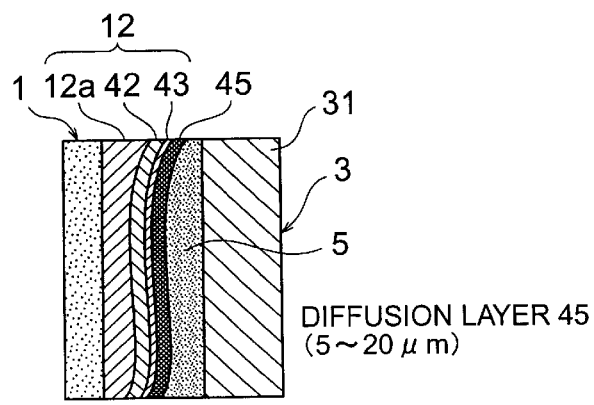
Figure 8D:
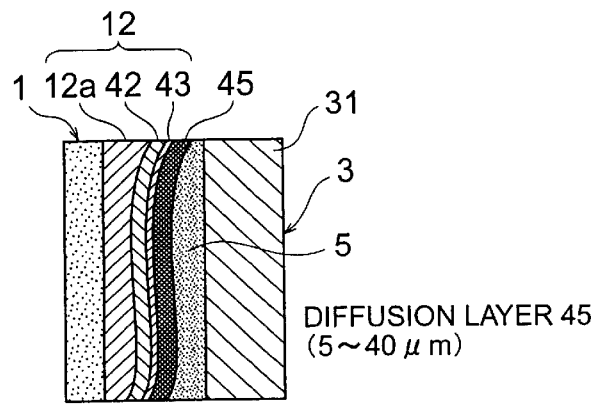

As these Samples 21 to 24, samples were prepared changed in the temperature condition (ambient temperature) and furnace time condition for the reflowing by the reflow furnace. The Samples 21 to 24 were analyzed as to the solder diffusion layer 45 of the Cu ingredient around the underlayer electrode 12a by known EPMA. The results are shown in Table 3 and FIGS. 8A to 8D. FIG. 8A shows a cross-section of the main part of the Sample 21 where the solder diffusion layer 45 does not appear, while FIGS. 8B to FIG. 8D show cross-sections of main parts of the Sample 22 to Sample 24 where the solder layer 45 appears.

TABLE 3

| | Solder Layer of Sn/Sb = 90/10 | | | |
|---|---|---|---|---|
| | Reflow temperature condition (ambient temperature) (° C.) | Furnace time condition (min) | Tensile strength (kgf) | Overall judgment |
| Sample 21 | 325 | 5 | 1.1 | NG |
| Sample 22 | 325 | 7 | 7.5 | OK |
| Sample 23 | 350 | 5 | 9.2 | OK |
| Sample 24 | 350 | 7 | 9.1 | OK |

In the case of Sample 21, at a temperature condition at reflow (ambient temperature) of 325° C. and a furnace time condition of 5 minutes, a solder diffusion layer 45 was not formed as shown in FIG. 8A. Note that the "ambient temperature at reflow" means the same as the maximum temperature at reflow in Table 2.

In the case of Sample 22, it was confirmed that a solder diffusion layer 45 of a thickness of 5 to 10 μm occurs in the solder layer 5 through the nickel plating layer 42 as shown in FIG. 8B by a temperature condition of 325° C. and a furnace time condition of 7 minutes. The temperature condition of Sample 22 is the same as the Sample 21. The reason why the difficult layer 45 was made was longer the time than Sample 21.

In the case of Sample 23, it was confirmed that a solder diffusion layer 45 of a thickness of 5 to 20 μm occurs in the solder layer 5 through the nickel plating layer 42 as shown in FIG. 8C by a temperature condition of 350° C. and a furnace time condition of 5 minutes.

In the case of Sample 24, it was confirmed that a solder diffusion layer 45 of a thickness of 5 to 40 μm occurs in the solder layer 5 through the nickel plating layer 42 as shown in FIG. 8D by a temperature condition of 350° C. and a furnace time condition of 7 minutes.

In Sample 21 to Sample 24, effects similar to the above case were obtained even for the bond structure of the terminal electrode 11 and the one end 21 of external terminal 2 shown in FIG. 2.

Next, in Sample 21 to Sample 24, the results of judgment of the tensile strength by a tensile strength test will be explained. The tensile strength test was performed by the method shown in FIG. 5 in the same way as in the above first embodiment.

As a result of the tensile strength test, in the case of Sample 21, there was no solder diffusion layer 45, the tensile strength was 1.1 kgf, the tensile strength in practical use was too small, and the result of judgment was In the case of Samples 22 to 24, the tensile strengths are values sufficient for practical use of 7.5 kgf, 9.2 kgf, and 9.1 kgf, respectively.

From the above experiment, it was confirmed that it is preferable to use a high temperature lead-free solder having a metal composition of the Sn—Sb system comprising Sn/Sb in a ratio of weight percent of 90/10, a solidus temperature of at least 240° C., and a liquid temperature of 268° C. as solder layers 4 and 5 and perform reflow in Samples 22 to 24. As a result, it is possible to cause occurrence of a solder diffusion layer 45 of a thickness of 5 to 40 μm in an underlayer electrode 12a and possible to obtain a composite multilayer capacitor provided with a bond structure superior in tensile strength and further having reflow resistance. Further, the solder used for this bond structure does not contain lead, so there is no concern over environmetal pollution.

Further, in the present embodiment, as the solder 81 used for soldering the terminal 23 of the external terminal 2 and conductor pattern 71 shown in FIG. 4, it is possible to use the above-mentioned Sn/Sb high temperature lead-free solder. Further, it is possible to use the above-mentioned Sn—Sb high temperature lead-free solder as the solder 81 used for soldering the terminal 33 of the external terminal 3 and the conductor pattern 72. In this case as well, in the same way as in the above case, it is possible to obtain a bond structure superior in tensile strength and further having reflow resistance. This bond structure is resistant to melting of the solder at the time of reflow for bonding other parts, so there is no fear of causing bridging to external circuits or other detrimental effects.

The present invention is not limited to the above embodiments. It can be similarly applied to a composite multilayer capacitor of a structure connecting and arranging two or three or more ceramic capacitor bodies 1 between a pair of external terminals.

Further, the composite multilayer capacitor of the present invention is suitable for use as a smoothening capacitor for a switching power source. Further, the present invention can also be applied to an electrode bond structure of coil parts, resistance parts, etc.

As explained above, according to the present invention, it is possible to provide a high quality electronic device with external terminals superior in tensile strength at the bonded parts between the terminal electrodes and external terminals and superior in reflow resistance. Further, since the solder used for the bonded parts does not contain lead, there is no concern over environmental pollution.

While the invention has been described with reference to specific embodiments chosen for purpose of illustration, it should be apparent that numerous modifications could be made thereto by those skilled in the art without departing from the basic concept and scope of the invention.

What is claimed is:

1. An electronic device with external terminals having terminal electrodes and external terminals of the electronic device body electrically bonded through solder layers, wherein said solder layers are comprised of an Sn—Sb high temperature lead-free solder, the ratio of Sn and Sb in the solder layers being, by weight percent, within a range of Sn/Sb=70/30 to 90/10, and each said solder layer and each said terminal electrode having formed between them a diffusion layer formed by diffusion of the conductive ingredients of said terminal electrode to the solder layer.

2. The electronic device with external terminals as set forth in claim 1, wherein said external terminals are comprised of members able to elastically deform in a length direction of said electronic device body.

3. The electronic device with external terminals as set forth in claim 1, wherein said solder layers are comprised of Sn—Sb high temperature solder having a solidus temperature of at least 240° C.

4. The electrode device with external terminals as set forth in claim 1, wherein said terminal electrodes have layers comprised mainly of Cu and the ingredients diffused into said diffusion layers are comprised mainly of Cu.

5. The electronic device with external terminals as set forth in claim 1, wherein said terminal electrodes have underlayer electrodes comprised mainly of Cu, nickel plating layers formed on the surfaces of said underlayer electrodes, and Sn plating layers formed on the surfaces of the Ni plating layers, and the Cu diffused into said diffusion layers diffuses there by passing through said Ni plating layers and Sn plating layers.

6. The electronic device with external terminals as set forth in claim 1, wherein the thickness of said diffusion layer is at least 5 µm.

7. An electronic device with terminal electrodes having terminal electrodes and external terminals of the electronic device body electrically bonded through solder layers, wherein each said solder layer and each said terminal electrode having formed between them a difffision layer having a thickness of at least 5 µm formed by diffusion of conductive ingredients of said terminal electrode into the solder layer, and said solder layers are comprised of an Sn—Sb high temperature solder having a solidus temperature of at least 240° C.

8. The electronic device with external terminals as set forth in claim 7, wherein said terminal electrodes have underlayer electrodes comprised mainly of Cu, and the conductive ingredients diffused in said solder layers are Cu.

9. The electronic device with external terminals as set forth in claim 7, wherein said terminal electrodes have underlayer electrodes comprised mainly of Cu and Ni plating layers formed on the surfaces of the underlayer electrodes, and the Cu of the conductive ingredients diffusing into the solder layers diffuse there through the Ni plating layers.

10. The electronic device with external terminals as set forth in claim 7, wherein said solder layers are comprised of an Sn—Sb high temperature lead-free solder, and the ratio between the Sn and Sb in the solder layers is, by ratio of weight percent, in the range of Sn/Sb=70/30 to 90/10.

11. The electronic device with external terminals as set forth in claim 7, wherein said external terminals are comprised of members able to elastically deform in a length direction of said electronic device body.

* * * * *